(12) United States Patent
Vuoristo

(10) Patent No.: US 11,827,968 B2
(45) Date of Patent: Nov. 28, 2023

(54) APPARATUS AND A METHOD FOR FORMING PATTERNS ON A SURFACE OF A SUBSTRATE PLATE BY A SPUTTERING PROCESS

(71) Applicant: Volframi Oy Ltd, Masku (FI)

(72) Inventor: Jukka Vuoristo, Masku (FI)

(73) Assignee: VOLFRAMI OY LTD, Masku (FI)

( * ) Notice: Subject to any disclaimer, the term of this patent is extended or adjusted under 35 U.S.C. 154(b) by 199 days.

(21) Appl. No.: 17/418,829

(22) PCT Filed: Dec. 18, 2019

(86) PCT No.: PCT/FI2019/000022
§ 371 (c)(1),
(2) Date: Jun. 27, 2021

(87) PCT Pub. No.: WO2020/136307
PCT Pub. Date: Jul. 2, 2020

(65) Prior Publication Data
US 2022/0064781 A1     Mar. 3, 2022

(30) Foreign Application Priority Data

Dec. 27, 2018  (FI) ..................................... 20187191

(51) Int. Cl.
| | |
|---|---|
| C23C 14/34 | (2006.01) |
| C23C 14/04 | (2006.01) |
| C23C 14/54 | (2006.01) |
| C23C 14/56 | (2006.01) |
| H01J 37/32 | (2006.01) |
| H01J 37/34 | (2006.01) |

(52) U.S. Cl.
CPC ............ *C23C 14/042* (2013.01); *C23C 14/34* (2013.01); *C23C 14/541* (2013.01); *C23C 14/56* (2013.01); *H01J 37/32513* (2013.01); *H01J 37/32724* (2013.01); *H01J 37/32899* (2013.01); *H01J 37/3447* (2013.01)

(58) Field of Classification Search
CPC ........... H01J 37/32513; H01J 37/32715; H01J 37/32724; H01J 37/32807; H01J 37/32899; H01J 37/3447; C23C 14/042; C23C 14/34; C23C 14/541; C23C 14/56; C23C 14/562
USPC ........................... 204/298.07, 298.11, 298.25
See application file for complete search history.

(56) References Cited

U.S. PATENT DOCUMENTS 6,235,171 B1 * 5/2001 Yamamoto ............ C23C 14/566
414/217
2013/0074763 A1 * 3/2013 Ikeda ...................... C23C 14/26
118/69

* cited by examiner

*Primary Examiner* — Rodney G McDonald
(74) *Attorney, Agent, or Firm* — Jacob Eisenberg

(57) ABSTRACT

The disclosure relates to an apparatus for forming patterns on a surface of a substrate plate by a sputtering process, and the apparatus comprises a first vacuum chamber, a sputtering source inside the first vacuum chamber, and an arrangement to place a mask between the sputtering source and the surface of the substrate plate. The disclosure also relates to a method for forming patterns on a surface of a substrate plate by a sputtering process.

17 Claims, 2 Drawing Sheets

APPARATUS AND A METHOD FOR FORMING PATTERNS ON A SURFACE OF A SUBSTRATE PLATE BY A SPUTTERING PROCESS

CROSS REFERENCE TO RELATED APPLICATIONS

This application is a national phase application of International Application No.: PCT/FI2019/000022, filed 18 Dec. 2019, and claims the priority benefit of Finnish Patent Application 20187191, filed 27 Dec. 2018, the content of both of which is incorporated herein by reference.

BACKGROUND OF THE INVENTION

The invention relates to an apparatus for forming patterns on a surface of a substrate plate by a sputtering process, and the apparatus comprises a first vacuum chamber, a sputtering source inside the first vacuum chamber, and an arrangement to place a mask between the sputtering source and the surface of the substrate plate. The invention also relates to a method for forming patterns on a surface of a substrate plate by a sputtering process.

Sputtering is a technique used to deposit thin films of a material onto a surface. By first creating a gaseous plasma and then accelerating the ions from this plasma into some source material, the source material is eroded by the arriving ions via energy transfer and it is ejected in the form of neutral particles, either individual atoms, clusters of atoms or molecules. For producing plasma, vacuum or low-pressure conditions are needed. These are achieved by vacuum chambers. As these neutral particles are ejected, they will travel in a straight line unless they come into contact with something, such as other particles or a nearby surface. If a surface such as a Si wafer is placed in the path of these ejected particles, it will be coated by a thin film of the source material. Sputtering is widely used for surface cleaning and etching, thin film deposition, surface layer analysis and as sputter ion sources.

A typical sputtering apparatus comprises a vacuum chamber, a cathode assembly, an anode, which can simply form the inside walls of the chamber, and a target attached to the cathode assembly. In the sputtering process, a substrate to be coated is placed within the chamber, opposite to the target. The chamber is evacuated to a low pressure and a suitable gas is introduced throughout the chamber. A suitable power supply is then utilized to apply a potential between the cathode and anode, thereby generating ions that accelerate toward the cathode assembly, striking the target with sufficient energy to cause the target to partially vaporize. The vaporized target material diffuses throughout the chamber and leaves a deposit in the form of a thin film on the substrate. The target is the sputtering material source. If there is a mask between the substrate and the target (the sputtering source), patterns can be formed on the substrate.

Touch surfaces are plates or similar structures having some electric control properties, such as on-off switches or slide controllers. These are implemented on walls, windows, panels or other surfaces by depositing various conductive or resistive patterns on the surface that are affixed to a plate or similar structure that is joined to said surface. But even though the circuit patterns are simple, they are not easy to produce. Some lithographic, etching, dispensing or similar processes are used. However, if the aim is to apply the conductive or resistive pattern directly onto the surface during manufacturing, for example on a window panel, quite a few problems arise because the panels are quite big, and using traditional methods may be impossible, cumbersome or at least excessively time-consuming. Using sputtering techniques for applying conductive or resistive patterns is usually out of the question because sputtering apparatuses must be bigger than the surface plate selected for processing, because the plate must fit inside the apparatus in its entirety. This makes the apparatus quite cumbersome and very expensive.

U.S. Pat. No. 4,478,701 discloses a sputtering apparatus for the depositing thin films on substrates. However, its construction is such that using it for big plates, such as described before, is a practical impossibility.

BRIEF DESCRIPTION OF THE SEVERAL VIEWS OF THE DRAWINGS

The object of the invention is a solution that can significantly reduce the disadvantages and drawbacks of the prior art. In particular, the object of the invention is a solution where a sputtering apparatus is provided that allows producing patterns on large substrate plates (the area of the plate is larger than the sputtering area of the apparatus, i.e. processing area).

The objects of the invention are attained with an arrangement that is characterised by what is stated in the independent patent claims. Some advantageous embodiments of the invention are disclosed in the dependent claims.

Figure 1:
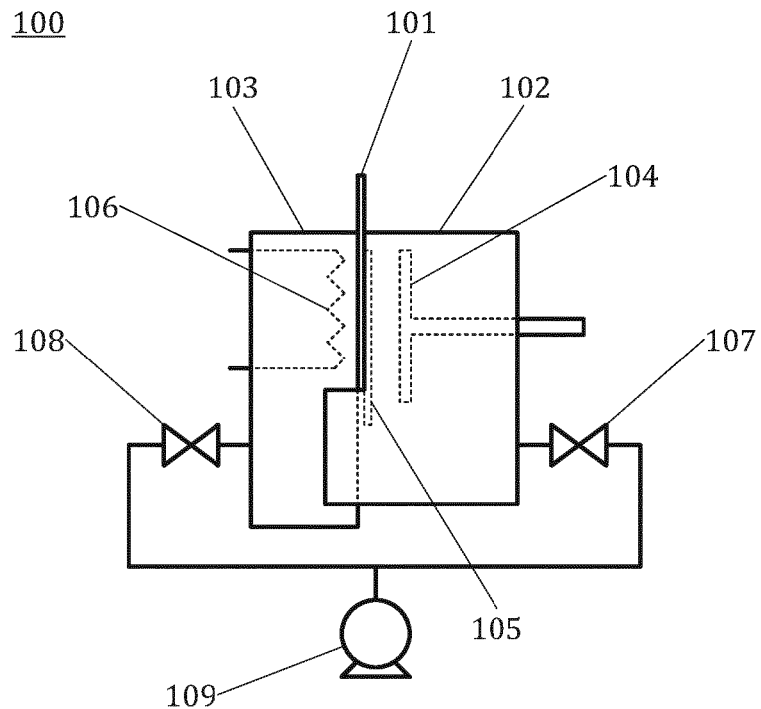

The invention is an apparatus for forming patterns on a surface of a substrate plate comprising a two-part vacuum chamber with a gap between the vacuum chamber parts. A substrate plate is situated vertically between the vacuum chambers in the gap. In one vacuum chamber is a sputtering arrangement and a mask, and in another vacuum chamber is a substrate surface heater. The side of the substrate plate on which the patterns are to be formed is placed towards the sputtering arrangement and another side faces the substrate surface heater. During the sputtering process, the pressure is equal in both vacuum chambers.

When reference is made in the text to the upper or the lower parts or respective directions such as down or up, a situation is described in which the apparatus according to the invention is resting on a surface such as a floor. Also, when reference is made to vertical or horizontal directions or surfaces, the apparatus is placed similarly.

It must be noted that the patterns formed by the apparatus can have different electrical properties than other areas of the substrate plate. They can have different visual or haptic properties, i.e. they have different color or they feel different when touching them. Naturally, the patterns may have all kind of combinations of properties.

In one embodiment of the invention is an apparatus for forming patterns on a surface of a substrate plate by a sputtering process, and the apparatus comprises a first vacuum chamber, a sputtering source inside the first vacuum chamber, and an arrangement to place a mask between the sputtering source and the surface of the substrate plate, and the apparatus has a processing area of the apparatus. In one advantageous embodiment of the invention, the apparatus is configured to receive plates, and these plates have a larger surface area than the processing area of the apparatus. The apparatus further comprises a second vacuum chamber and a substrate surface heater inside the second vacuum chamber. The first vacuum chamber and the second vacuum chamber are configured in a such way that there is a gap for the substrate plate between the vacuum chambers and they are to be placed on opposite sides of the substrate plate in such a way that they cover the same place on the plate, and during the sputtering process both vacuum chambers are pressured to an equal degree. In some embodiments the substrate plates are in a vertical orientation. There are also embodiments, where the apparatus is turnable in different positions, so the apparatus can receive substrate plates in different inclinations, from vertical to horizontal.

In one embodiment of the apparatus, there is a sealing arrangement at least on some parts of the edges of the first vacuum chamber, the second vacuum chamber or both. This arrangement prevents air from leaking into the vacuum chambers. In a second embodiment of the apparatus, the sealing arrangement is configured to hold the substrate plate during the sputtering process and release the substrate plate when the substrate plate is to be repositioned or removed.

In a third embodiment of the apparatus, the apparatus is configured to receive plates, which plates are in a vertical orientation, and the first vacuum chamber and the second vacuum chamber are movable in the vertical direction and they are configured to be lowered when the substrate plate is repositioned for sputtering. These movements of the vacuum chambers also correspond to the movements of the vacuum chambers when the apparatus is configured to receive the substrate plate in different positions.

In a fourth embodiment of the apparatus, the apparatus is configured to receive plates, which plates are in a vertical orientation, the first vacuum chamber and the second vacuum chamber are movable in the vertical direction and they are configured to be lowered when the apparatus is moved in relation to the substrate plate to the sputtering place. These movements of the vacuum chambers also correspond to the movements of the vacuum chambers when the apparatus is configured to receive the substrate plate in different positions.

In a fifth embodiment of the apparatus, when the apparatus is put in place for sputtering, the first vacuum chamber and the second vacuum chamber extend over the edge of the substrate plate. When the substrate plate is in vertical position, the first vacuum chamber and the second vacuum chamber extend below the lower edge of the substrate plate.

In a sixth embodiment of the apparatus, the first vacuum chamber and the second vacuum chamber are movable in relation to each other in order to adjust the width of the gap for the substrate plate. When the substrate plate is in vertical position, the vacuum chambers are movable in relation to each other in a horizontal direction in order to adjust the width of the gap for the substrate plate.

In a seventh embodiment of the apparatus, the gap has a bottom or a back wall, and a part of the first vacuum chamber or of the second vacuum chamber is configured to form the bottom or the back wall of the gap for the substrate plate. If the deepest surface of the gap is called the bottom or the back wall of the gap, depends in which position the apparatus is for receiving the substrate plate.

In an eight embodiment of the apparatus, the apparatus is configured in such a way that during the sputtering process, the lower edge of the substrate plate is resting on the bottom or the back wall of the gap.

In a ninth embodiment of the apparatus, the sputtering source extends over the bottom or the back wall of the gap, i.e. the processing area of the apparatus extends over the bottom or the back wall of the gap.

In a tenth embodiment of the apparatus, there is a second sealing arrangement on the upper edges of the gap and the apparatus is configured in such a way that the substrate plate extends over the upper edges of the gap during the sputtering process.

In an eleventh embodiment of the apparatus, the sputtering source extends below the bottom of the gap.

In a twelfth embodiment of the apparatus, the substrate surface heater is configured to heat the area to be sputtered on the opposite surface of the substrate plate.

In a thirteenth embodiment of the apparatus, there is a first pressure valve in the first vacuum chamber and a second pressure valve in the second vacuum chamber, and the first pressure valve and the second pressure valve are connected to a pump system.

In a thirteenth embodiment of the apparatus, the apparatus comprises a washing and drying arrangement for cleaning at least the area of the substrate plate which is to be sputtered before the said area is moved between the first vacuum chamber and the second vacuum chamber.

In a fourteenth embodiment of the apparatus, the patterns have electrical, optic or haptic properties different from the other areas of the substrate plate, or any combination of said properties.

One embodiment of the invention is a method for forming patterns on a surface of a substrate plate by a sputtering process. In one advantageous embodiment of the invention, the apparatus described previously is used, and the method comprises steps where the substrate plate is moved in through the gap until the area to be sputtered is between the vacuum chambers, and the apparatus is positioned in a such way that the substrate plate is between the vacuum chambers and the vacuum chambers are moved towards each other so that the edges of the vacuum chambers are tightly pressed against the surfaces of the substrate plate. The method further comprises steps where air is pumped out of the vacuum chambers and the pressure is kept equal in both vacuum chambers, the area on the substrate plate where the pattern is to be sputtered is heated from the opposite surface by the substrate surface heater inside the second vacuum chamber, the pattern is sputtered on the substrate plate, and ambient pressure is restored to both vacuum chambers and the substrate plate is released and repositioned.

In an embodiment of the method, the gap has a bottom of the gap or a back wall of the gap, and during the sputtering process the substrate plate is resting on the bottom of the gap or touching the back wall of the gap.

It is an advantage of the invention that it provides an apparatus that makes it possible to sputter patterns on a substrate plate that is larger than the sputtering apparatus. Using the apparatus significantly improves the results of manufacturing the touch surfaces.

One advantage of the invention is that it is fast to use and the apparatus is small in size. The invention also keeps the opposing surfaces of the substrate plate separate during the sputtering processes.

It is a further advantage of the invention that it reduces the need to attach separate conductive pattern arrangements, for example a touch surface arrangement, to a large plate.

It is a further advantage of the invention that it makes it possible to form patterns that extend to the edges of the substrate plate. Also less process gasses are consumed.

BRIEF DESCRIPTION OF THE SEVERAL VIEWS OF THE DRAWINGS

Further advantages features and details of the various embodiments of this disclosure will become apparent from the ensuing description of a preferred exemplary embodiment and with the aid of the drawings. The features and combinations of features recited below in the description, as well as the features and feature combination shown after that in the drawing description or in the drawings alone, may be used not only in the particular combination recited, but also in other combinations on their own, with departing from the scope of the disclosure.

Figure 2:
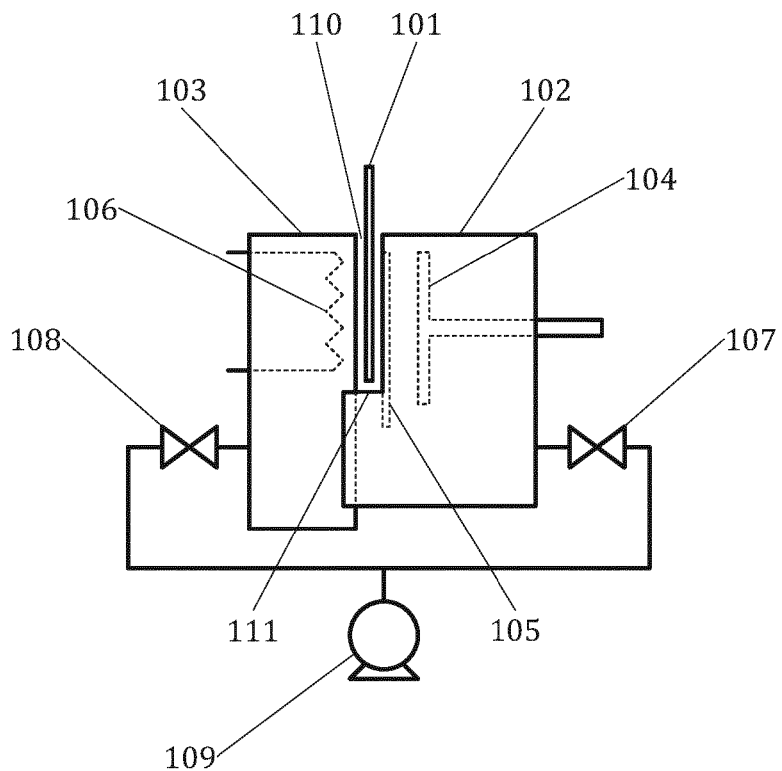
Figure 3:
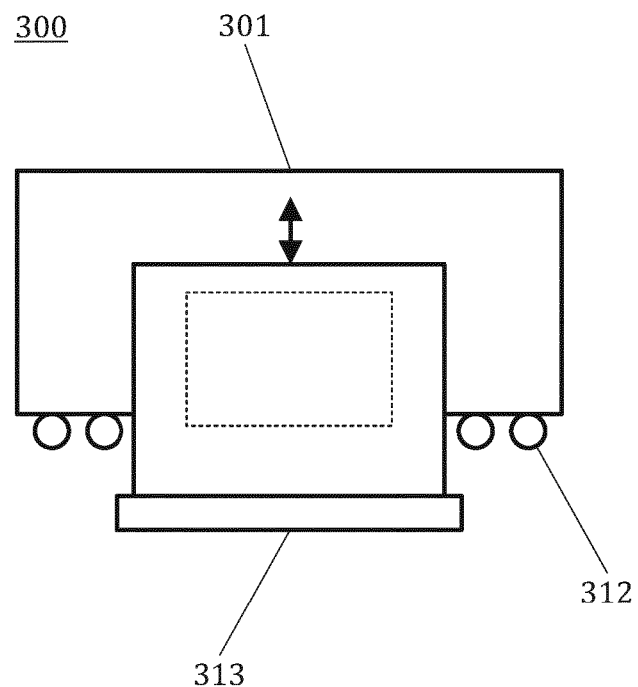
Figure 4:
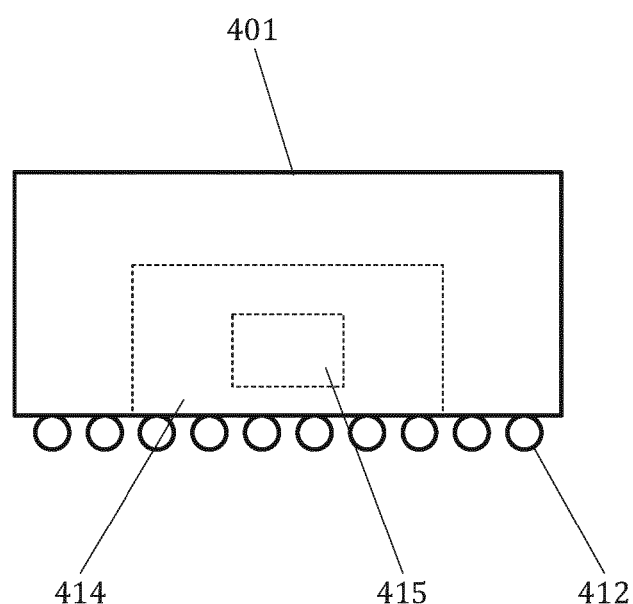

In the following, the invention is described in detail. The description refers to the accompanying drawings, in which FIG. 1 shows an example of an apparatus in accordance with an embodiment, FIG. 2 shows the apparatus described on the FIG. 1 when the substrate plate is moved, FIG. 3 shows a second example of an apparatus in accordance with an embodiment, and FIG. 4 shows an example of a substrate plate.

DETAILED DESCRIPTIONS OF THE INVENTION

As used throughout the present disclosure, unless specifically stated otherwise, the term "or" encompasses all possible combinations, except where infeasible. For example, the expression "A or B" shall mean A alone, B alone, or A and B together. If it is stated that a component includes "A, B, or C", then, unless specifically stated otherwise or infeasible, the component may include A, or B, or C, or A and B, or A and C, or B and C, or A and B and C. Expressions such as "at least one of" do not necessarily modify an entirety of the following list and do not necessarily modify each member of the list, such that "at least one of "A, B, and C" should be understood as including only one of A, only one of B, only one of C, or any combination of A, B, and C.

The embodiments in the following description are given as examples only and someone skilled in the art can carry out the basic idea of the invention also in some other way than what is described in the description. Though the description may refer to a certain embodiment or embodiments in several places, this does not mean that the reference would be directed towards only one described embodiment or that the described characteristic would be usable only in one described embodiment. The individual characteristics of two or more embodiments may be combined and new embodiments of the invention may thus be provided.

FIG. 1 shows an embodiment of an apparatus 100. The apparatus is for forming patterns on a surface of a substrate plate 101 by a sputtering process. The apparatus comprises a first vacuum chamber 102, a second vacuum chamber 103, a sputtering source 104, a mask 105, a substrate surface heater 106, a first pressure valve 107, a second pressure valve and a pump system 109. The patterns have different properties compared to the other areas of the substrate plate.

The apparatus 100 is configured to receive substrate plates 101 which are in a vertical orientation, i.e. the short sides of a substrate plate are downwards and upwards. The sputtering source 104 is in the first vacuum chamber 102 and the substrate surface heater 106 is in the second vacuum chamber 103. The first vacuum chamber and the second vacuum chamber are configured in such a way that between the chamber is a gap where the substrate plate is to be placed. The apparatus is configured in such a way that the width of the gap is adjustable. This is achieved by making both vacuum chambers movable in relation to each other or by making either of vacuum chamber movable. It must be noted that the apparatus can be in different positions, i.e. the substrate plates can be also in different positions. There are also embodiments where the apparatus is turnable, so it can receive substrate plates which are in different positions.

The first vacuum chamber 102 and the second vacuum chamber 103 have openings in the gap. The opening in the first vacuum chamber allows forming conductive patterns on the surface of the substrate plate 101 by the sputtering process. Between the surface of the substrate plate and the sputtering source 104 is the mask 105. The mask is modified according to the patterns to be formed. There is an arrangement for replacing the mask with another mask. The opening in the second vacuum chamber is for heating the substrate plate by the substrate surface heater 106. The heated area is on the opposite side of the substrate plate in relation to the area where the patterns are to be formed. The heating serves to dehydrate the substrate plate and to improve adhesion.

The vacuum chambers are configured in a such way that some part of the wall of either vacuum chamber forms the bottom of the gap. In the embodiment presented in FIG. 1, the wall of the first vacuum chamber 102 extends below the opening towards the second vacuum chamber 103 in a such way that there is a step in the wall of the first vacuum chamber and this step forms the bottom of the gap. The lower edge of the mask 105 in the first vacuum chamber extends below the bottom of the gap. This allows patterns that extend to the edge of the substrate plate 101 to be formed. The bottom of the gap can also be called the back wall of the gap. Which phrase is used may depend which position the apparatus is positioned. However, the bottom or the back wall of the gap is the surface which is configured to receive the edge of the substrate plate against said surface during the sputtering process.

When the substrate plate 101 is placed in the apparatus 100, the gap is opened and the vacuum chambers are lowered. Of course, there are embodiments where the substrate plate is lifted into place. And, of course, the substrate plate may have different positions than the vertical position. In those embodiments, the apparatus is positioned accordingly. The movements of the vacuum chambers in relation to the substrate plate are similar. When the substrate plate is placed in such a way that the area where the patterns are to be formed is at the opening of the first vacuum chamber 102, the gap is closed and the vacuum chambers are lifted. When this is done, the bottom side of the substrate plate rest on the bottom of the gap and the vacuum chambers are tightly closed against the substrate plate. The substrate plate works as a barrier between the first vacuum chamber and the second vacuum chamber. The vacuum chambers and the substrate plate are positioned in such a way that air can be pumped out of the chambers and a vacuum or a low-pressure environment can be formed in the chambers. In some embodiments there is a sealing arrangement at least on some parts of the edges of the first vacuum chamber or the second vacuum chamber or both. The sealing arrangement improves the air-tightness of the vacuum chambers. The sealing arrangement is configured to hold the substrate plate during the sputtering process and to release the substrate plate when the substrate plate is to be repositioned or removed.

The first vacuum chamber 102 and the second vacuum chamber 103 are separate during the pattern forming process, i.e. gasses inside the first vacuum chamber and the second vacuum chamber do not mix. This allows using process gas only in the first vacuum chamber. Also, the surface of the substrate plate which is towards the second vacuum chamber stays clean and untouched by the sputtering.

During the pattern forming process, both vacuum chambers are pressured to an equal degree. This prevents the substrate plate 101 breaking or bending if there is a pressure difference between the first vacuum chamber and the second vacuum chamber. For controlling the pressure, there is a first pressure valve 107 in the first vacuum chamber 102 and the second pressure valve 108 in the second vacuum chamber 103. There is a pump system 109 and the first pressure valve and the second pressure valve are connected to it.

FIG. 2 shows the apparatus 100 described in FIG. 1 when the substrate plate 101 is about to be moved. The first vacuum chamber 102 and the second vacuum chamber 103 are moved away from each other in order to widen the gap 110. The apparatus is lowered to such a degree that the substrate plate is not touching the bottom 111 of the gap. The substrate plate does not cover the vacuum chamber openings and in the vacuum chambers there is ambient pressure. When the patterns have been formed, the substrate plate removed. The substrate plate can also be repositioned to form a new pattern. If that is the case, the vacuum chambers are lifted until the substrate plate is resting on the bottom 111 of the gap and the vacuum chambers are pressed against the substrate plate. Air is removed from the vacuum chambers and process gas is added to the first vacuum chamber. The sputtering process is then used to form patterns on the surface of the substrate plate that faces the first vacuum chamber.

In some embodiments, the apparatus 100 or some parts of it are movable along the substrate plate 101, which is kept stationary. Of course, there are embodiments where both the apparatus and the substrate are movable when adjusting the conductive pattern to be formed on the substrate plate.

In some embodiments, the apparatus 100 comprises a washing and drying arrangement for cleaning at least the area of the substrate plate that is to be sputtered before the said area is moved between the first vacuum chamber and the second vacuum chamber. The substrate surface heater 106 serves to enhance the drying process.

FIG. 3 shows a second embodiment of an apparatus 300. The apparatus forms conductive patterns on a surface of a substrate plate 301 by a sputtering process. Of course, other kind of patterns can be formed, too. The main parts of the apparatus are mainly similar to the embodiment that was described in FIG. 1. There is a substrate plate moving arrangement 312 for moving the substrate plate in the vertical orientation, i.e. the vertical dimension of the cross section of the substrate plate is larger than the horizontal dimension when it is in the apparatus for forming the patterns. The apparatus comprises an apparatus moving arrangement 313 for moving the apparatus in the horizontal direction. When the substrate plate is moved through the apparatus by using the substrate plate moving arrangement, the apparatus is lowered by the apparatus moving arrangement. The apparatus is moved for at least the distance that is needed to make the lower edge of the substrate plate does not touch the bottom of the gap.

When the apparatus 300 is positioned where the conductive patterns are to be formed, the apparatus is raised by the apparatus moving arrangement 313 until the bottom of the gap touches the lower edge of the substrate plate. Then the first vacuum chamber and the second vacuum chamber are moved towards each other until they squeeze the substrate plate between them and isolate the chambers from ambient atmosphere and from each other. The bottom of the gap is configured in such a way that the lower edge of the substrate plate seals the seam between the vacuum chambers.

FIG. 4 show an example of a substrate plate 401 where a conductive pattern 415 is formed on a surface of the substrate plate. The substrate plate is carried by a substrate plate moving arrangement 412. The area that is available for patterning is a sputtered area 414. By adapting the mask 415, the pattern's size and shape can be chosen. Because the first vacuum chamber and the lower edges of the mask and the sputtering source extend below the bottom of the gap and at the same time below the lower edge of the substrate plate, too, the patterns can be extended to the edge of the substrate plate.

Some advantageous embodiments of the method and apparatus according to the invention have been described above. The invention is however not limited to the embodiments described above, but the inventive idea can be applied in numerous ways within the scope of the claims.

The invention claimed is:

1. An apparatus for forming patterns on a surface of a substrate plate by a sputtering process, the apparatus comprising:
   a first vacuum chamber,
   a sputtering source arranged inside the first vacuum chamber,
   an arrangement configured for placing a mask between the sputtering source and the surface of the substrate plate,
   a processing area, and
   wherein the apparatus is configured to receive substrate plates having a larger surface area than the processing area, and
   wherein the apparatus further comprises a second vacuum chamber and a substrate surface heater arranged inside the second vacuum chamber, and
   wherein the first vacuum chamber and the second vacuum chamber are configured in such a way that there is a gap for the substrate plate between the vacuum chambers, and
   wherein the vacuum chambers are configured to be placed on opposite sides of the substrate plate in such a way that they cover the same place on the substrate plate, and
   wherein during the sputtering process both vacuum chambers are pressurised to an equal degree.

2. The apparatus according to claim 1, further comprising a sealing arrangement arranged at least on some parts of edges of at least one of the first vacuum chamber and the second vacuum chamber.

3. The apparatus according claim 2, wherein the sealing arrangement is configured to hold the substrate plate during the sputtering process and release the substrate plate when the substrate plate is to be repositioned or removed.

4. The apparatus according to claim 1, wherein the apparatus is configured to receive substrate plates arranged in a vertical orientation, and the first vacuum chamber and the second vacuum chamber are arranged to be movable in a vertical direction and configured to be lowered when the substrate plate is repositioned for sputtering.

5. The apparatus according to claim 1, wherein the apparatus is configured to receive substrate plates arranged in a vertical orientation, and the first vacuum chamber and the second vacuum chamber are arranged to be movable in a vertical direction and configured to be lowered when the apparatus is moved in relation to the substrate plate to a sputtering place.

6. The apparatus according to claim 1, wherein when the apparatus is put in place for sputtering, the first vacuum chamber and the second vacuum chamber are arranged to extend over the edge of the substrate plate.

7. The apparatus according to claim 1, wherein the first vacuum chamber and the second vacuum chamber are arranged to be movable in relation to each other in order to adjust the width of the gap for the substrate plate.

8. The apparatus according to claim 1, wherein the gap comprises a bottom or a back wall, and a part of the first vacuum chamber or the second vacuum chamber is configured to form the bottom or the back wall of the gap for the substrate plate.

9. The apparatus according to claim 8, wherein the apparatus is configured such that during the sputtering process an edge of the substrate plate rests on the bottom or the back wall of the gap.

10. The apparatus according to claim 8, wherein the sputtering source is arranged to extend over the bottom or the back wall of the gap.

11. The apparatus according to claim 1, further comprising a sealing arrangement arranged on outer edges of the gap and the apparatus is configured in such a way that the substrate plate extends over outer edges of the gap during the sputtering process.

12. The apparatus according to claim 1, wherein the substrate surface heater is configured to heat the area to be sputtered on the opposite surface of the substrate plate.

13. The apparatus according to claim 1, further comprising a first pressure valve in the first vacuum chamber and a second pressure valve in the second vacuum chamber, wherein the first pressure valve and the second pressure valve are connected to a pump system.

14. The apparatus according to claim 1, further comprising a washing and drying arrangement for cleaning at least an area of the substrate plate that is to be sputtered before the area is moved between the first vacuum chamber and the second vacuum chamber.

15. The apparatus according to claim 1, wherein the patterns comprise at least one of electrical, optic and haptic properties, wherein the properties are different from properties of other areas of the substrate plate.

16. A method for forming patterns on a surface of a substrate plate by a sputtering process, the method comprising the steps of:
    moving the substrate plate through a gap until an area to be sputtered is between vacuum chambers;
    moving the vacuum chambers towards each other so that the edges of the vacuum chambers are pressed against the surfaces of the substrate plate;
    pumping air out of the vacuum chambers and keeping the pressure equal in both vacuum chambers;
    heating an area on the substrate plate where the pattern is to be sputtered from an opposite surface by the substrate surface heater inside the second vacuum chamber;
    sputtering a pattern on a substrate plate, and
    restoring ambient pressure to both vacuum chambers and releasing and repositioning the substrate plate.

17. The method according claim 16, wherein the gap comprises a bottom or a back wall, and during the sputtering process the substrate plate is resting on the bottom of the gap or touching the back wall of the gap.

* * * * *